United States Patent
Yamaguchi et al.

(10) Patent No.: US 10,884,329 B2
(45) Date of Patent: Jan. 5, 2021

(54) WAVELENGTH CONVERSION ELEMENT, LIGHT SOURCE APPARATUS, AND IMAGE PROJECTION APPARATUS

(71) Applicant: CANON KABUSHIKI KAISHA, Tokyo (JP)

(72) Inventors: Yutaka Yamaguchi, Sakura (JP); Masayuki Abe, Tokyo (JP); Minoru Ohkoba, Utsunomiya (JP); Daisuke Ogawa, Toda (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 246 days.

(21) Appl. No.: 16/193,228

(22) Filed: Nov. 16, 2018

(65) Prior Publication Data

US 2019/0101814 A1    Apr. 4, 2019

Related U.S. Application Data

(63) Continuation of application No. PCT/JP2017/020163, filed on May 30, 2017.

(30) Foreign Application Priority Data

Jun. 1, 2016 (JP) .................. 2016-109932

(51) Int. Cl.
*G03B 21/20* (2006.01)
*G02B 5/20* (2006.01)
(Continued)

(52) U.S. Cl.
CPC ............. *G03B 21/204* (2013.01); *G02B 5/20* (2013.01); *G03B 21/14* (2013.01); *G03B 21/16* (2013.01); *H01L 33/50* (2013.01)

(58) Field of Classification Search
CPC ...... G03B 21/14; G03B 21/20; G03B 21/204; G02B 5/20; H01L 33/50
See application file for complete search history.

(56) References Cited

U.S. PATENT DOCUMENTS 7,278,756 B2 *  10/2007  Leu ..................... G02B 6/0023
                                                              257/100
9,146,453 B2    9/2015   Kasugai et al.
(Continued)

FOREIGN PATENT DOCUMENTS

CN    102023464 A    4/2011
CN    102289140 A    12/2011
(Continued)

OTHER PUBLICATIONS

Office Action issued in Chinese Appln. No. 201780032682.6 dated Jul. 16, 2020. English translation provided.

(Continued)

*Primary Examiner* — Thomas M Sember
(74) *Attorney, Agent, or Firm* — Rossi, Kimms & McDowell LLP (57) ABSTRACT

A wavelength conversion element includes a fluorescent portion in which fluorescent particles are dispersed in a binder. The fluorescent portion has a first surface and a second surface which are opposite to each other in a thickness direction and excitation light is irradiated from a second surface side. A volume density of the fluorescent particles in a first portion is higher than that in a second portion where the fluorescent portion is divided in the thickness direction into two of the first portion on a first surface side and the second portion on the second surface side. A thickness of the fluorescent portion is at least 5 times as long as an average particle size of the fluorescent particles.

21 Claims, 5 Drawing Sheets

(51) Int. Cl.
  *G03B 21/16* (2006.01)
  *H01L 33/50* (2010.01)
  *G03B 21/14* (2006.01)

(56) References Cited

U.S. PATENT DOCUMENTS

| | | | |
|---|---|---|---|
| 9,644,803 B2 | 5/2017 | Kasugai | |
| 2011/0310362 A1 | 12/2011 | Komatsu | |
| 2013/0149508 A1* | 6/2013 | Kwak | B32B 3/16 |
| | | | 428/201 |
| 2014/0211170 A1 | 7/2014 | Kitano | |
| 2015/0002824 A1 | 1/2015 | Kasugai | |
| 2015/0171372 A1 | 6/2015 | Iwata et al. | |
| 2016/0147136 A1 | 5/2016 | Nojima | |

FOREIGN PATENT DOCUMENTS

| | | |
|---|---|---|
| CN | 102636947 A | 8/2012 |
| CN | 103900035 A | 7/2014 |
| CN | 103969935 A | 8/2014 |
| CN | 104141926 A | 11/2014 |
| CN | 104169637 A | 11/2014 |
| CN | 104769497 A | 7/2015 |
| CN | 105045022 A | 11/2015 |
| CN | 105182610 A | 12/2015 |
| JP | 2003101078 A | 4/2003 |
| JP | 2015094777 A | 5/2015 |
| JP | 2016099558 A | 5/2016 |
| JP | 2016218151 A | 12/2016 |
| WO | 2013190778 A1 | 12/2013 |
| WO | 2014006987 A1 | 1/2014 |

OTHER PUBLICATIONS

International Preliminary Report on Patentability issued in Intl. Appln. No. PCT/JP2017/020163 dated Dec. 13, 2018.
English translation of Written Opinion issued in Intl. Appln. No. PCT/JP2017/020163 dated Aug. 29, 2017, previously cited in IDS filed Nov. 16, 2018.
International Search Report issued in Intl. Appln. No. PCT/JP2017/020163 dated Aug. 29, 2017. English translation provided.
Written Opinion issued in Intl. Appln. No. PCT/JP2017/020163 dated Aug. 29, 2017.
Informal Comment filed in Intl. Appln. No. PCT/JP2017/020163 on Oct. 24, 2017. English translation provided.

* cited by examiner

WAVELENGTH CONVERSION ELEMENT, LIGHT SOURCE APPARATUS, AND IMAGE PROJECTION APPARATUS

CROSS-REFERENCE TO RELATED APPLICATIONS

This application is a Continuation of International Patent Application No. PCT/JP2017/020163, filed on May 30, 2017, which claims the benefit of Japanese Patent Application No. 2016-109932, filed on Jun. 1, 2016, both of which are hereby incorporated by reference herein in their entirety.

BACKGROUND OF THE INVENTION

Field of the Invention

The present invention relates to a wavelength conversion element that emits fluorescent light by wavelength-converting excitation light and a light source apparatus using the wavelength conversion element, and more particularly to a wavelength conversion element suitable for an image projection apparatus.

Description of the Related Art

The light source apparatus as described above condenses and irradiates the excitation light, such as a laser beam, at a high density onto a fluorescent layer in the wavelength conversion element, thereby efficiently emitting the fluorescent light. The fluorescent layer contains a binder and fluorescent particles dispersed in the binder.

However, due to the excitation light condensed and irradiated with the high density, the fluorescent layer is likely to be hot, and the deteriorated fluorescent layer and the lowered luminous efficiency of a fluorescent body in the fluorescent layer are concerned.

Japanese Patent Laid-Open No. 2015-94777 discloses a method of forming a fluorescent layer in which fluorescent particles are dispersed in a binder made of an inorganic material so that the fluorescent particles can contact a metal substrate to promote heat radiations.

The method disclosed in Japanese Patent Laid-Open No. 2015-94777 is expected to provide the heat radiation promoting effect of the fluorescent body near the substrate in the fluorescent layer, but its heat radiation promoting effect of the fluorescent particles is unclear near the incident surface onto which the excitation light is irradiated. In addition, since the intensity of the irradiated excitation light is higher on the incident surface side, there is a large local temperature difference (temperature gradient) between the incident surface side portion and the substrate side portion in the fluorescent layer and cracks caused by the resultant stress etc. may occur.

SUMMARY OF THE INVENTION

The problem is that it is impossible to suppress the temperature gradient of the fluorescent layer (or portion) caused by the irradiation of the excitation light.

A wavelength conversion element according to one aspect of the present invention includes a fluorescent portion in which fluorescent particles are dispersed in a binder, wherein the fluorescent portion has a first surface and a second surface which are opposite to each other in a thickness direction and excitation light is irradiated from a second surface side. A volume density of the fluorescent particles in a first portion is higher than that in a second portion where the fluorescent portion is divided in the thickness direction into two of the first portion on a first surface side and the second portion on the second surface side. A thickness of the fluorescent portion is at least 5 times as long as an average particle size of the fluorescent particles.

A light source apparatus that includes a light source configured to emit excitation light, and the above wavelength conversion element also constitutes another aspect of the present invention.

An image projection apparatus that includes the above light source apparatus, and an optical system configured to project an image by modulating light from the light source apparatus with a light modulation element also constitutes another aspect of the present invention.

A manufacturing method of a wavelength conversion element according to another aspect of the present invention that includes a fluorescent portion in which fluorescent particles are dispersed in a binder, wherein the fluorescent portion has a first surface and a second surface which are opposite to each other in a thickness direction and excitation light is irradiated from a second surface side includes the steps of preparing a first material in which the fluorescent particles are dispersed with a first volume density in the binder and a second material in which the fluorescent particles are dispersed with a second volume density higher than the first volume density in the binder, and laminating the first material and the second material so that the second material is located on a first surface side and a thickness of the fluorescent portion is at least 5 times as long as an average particle size of the fluorescent particles.

Further features of the present invention will become apparent from the following description of exemplary embodiments with reference to the attached drawings.

DESCRIPTION OF THE EMBODIMENTS

Referring now to the accompanying drawings, a description will be given of embodiments according to the present invention.

Example 1

Figure 1:
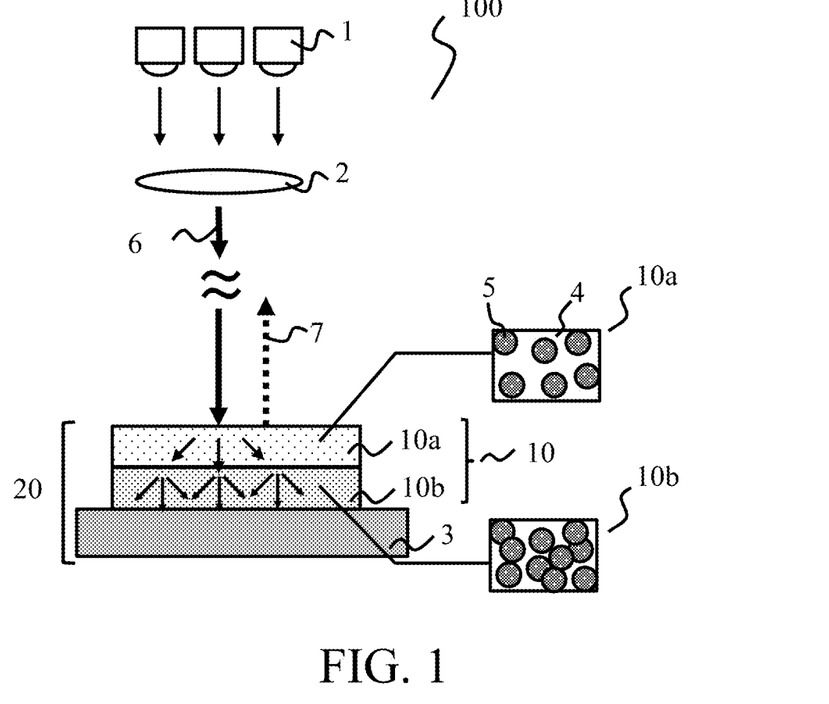
FIG. 1 illustrates a configuration of a light source apparatus according to example 1 of the present invention.

FIG. 1 illustrates a configuration of a light source apparatus 100 according to example 1 of the present invention. The light source apparatus 100 includes a light emitting element (laser diode) 1 as a light source, a wavelength conversion element 20, and a light source optical system 2.

The light emitting element 1 emits a blue laser beam (around a wavelength of 450 nm) as excitation light 6. The wavelength conversion element 20 includes a substrate 3 and a fluorescent layer (fluorescent portion) 10 formed on and supported by the substrate 3. The light source optical system 2 guides the excitation light 6 emitted from the light emitting element 1 to the wavelength conversion element 20 (fluorescent layer 10).

The fluorescent layer 10 includes a binder 4 and a plurality of fluorescent particles 5 dispersed in the binder 4. The fluorescent particles 5 absorb and wavelength-converts the excitation light 6, and emits light having a wavelength (500 nm to 650 nm) longer than that of the excitation light 6 as fluorescent light 7. In addition, the fluorescent layer 10 diffuses (reflects or transmits) part of the excitation light without any wavelength conversions. The light source apparatus 100 emits combined light (white light) of the fluorescent light 7 emitted from the fluorescent layer 10 and an unillustrated diffused component as unconverted excitation light.

The excitation light 6 emitted from the light emitting element 1 is condensed at a high density by the light source optical system 2 and irradiated onto a region having a predetermined area on an incident surface (second surface) opposite to a substrate contact surface (first surface) that contacts a substrate 3 on the fluorescent layer 10 in the layer thickness direction. The excitation light 6 that has entered the fluorescent layer 10 from the incident surface travels while diffusing in the fluorescent layer 10. When the excitation light 6 is absorbed by the fluorescent particles 5, part of its energy becomes the fluorescent light 7 and released from the fluorescent particles 5 and the remaining energy is released as heat.

The substrate 3 is made of a material having a high reflectance and a high thermal conductivity, such as metal (aluminum or the like), sapphire and spinel coated with an enhanced reflective film for the fluorescent wavelength. The substrate 3 serves to reflect toward the incident surface side the excitation light 6 that has reached the substrate 3 via the fluorescent layer 10, and the fluorescent light 7 emitted from the fluorescent particles 5. In addition, the substrate 3 is cooled on its back side (opposite to the fluorescent layer 10) and promotes the heat radiation from the fluorescent layer 10.

One half (or first portion) on the substrate contact surface side when the fluorescent layer 10 is equally divided into two in the layer thickness direction will be referred to as a substrate side portion 10b, and the other half (or second portion) on the incident surface side will be referred to as an incident surface side portion 10a. Then, as enlarged in a frame in FIG. 1, the fluorescent layer 10 is formed such that the volume density of the fluorescent particles 5 in the substrate side portion 10b is higher than that of the incident surface side portion 10a. The volume density of the fluorescent particles 5 (vol %: hereinafter referred to as a "fluorescent volume density") as used herein is a ratio of the volume occupied by the fluorescent particles 5 in the unit volume of the fluorescent layer 10 (the binder 4 and the fluorescent particles 5). For example, FIG. 1 illustrates an example in which the fluorescent volume density of the incident surface side portion 10a is 38% and the fluorescent volume density of the substrate side portion 10b is 58%. Thus, controlling (setting) the fluorescent volume density in the fluorescent layer 10 can moderate the temperature gradient in the fluorescent layer 10 or make the temperature distribution uniform, suppressing cracks caused by the stress.

Figure 2:
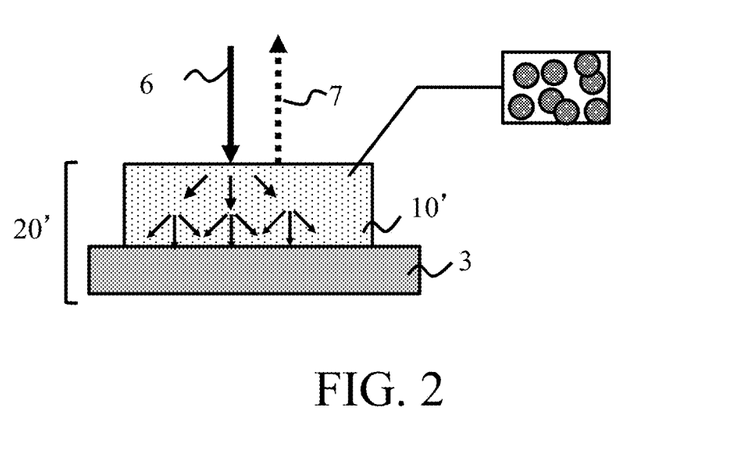
FIG. 2 illustrates a configuration of a light source apparatus as a comparative example.
Figure 3:
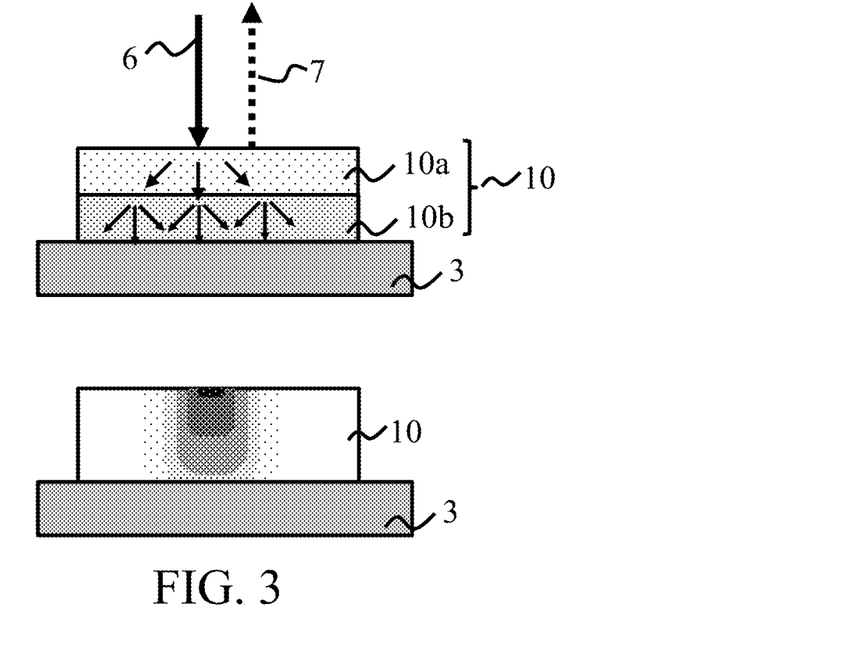
FIG. 3 illustrates excitation light traveling in a fluorescent layer and a temperature distribution in the fluorescent layer in the light source apparatus according to the example 1.
Figure 4:
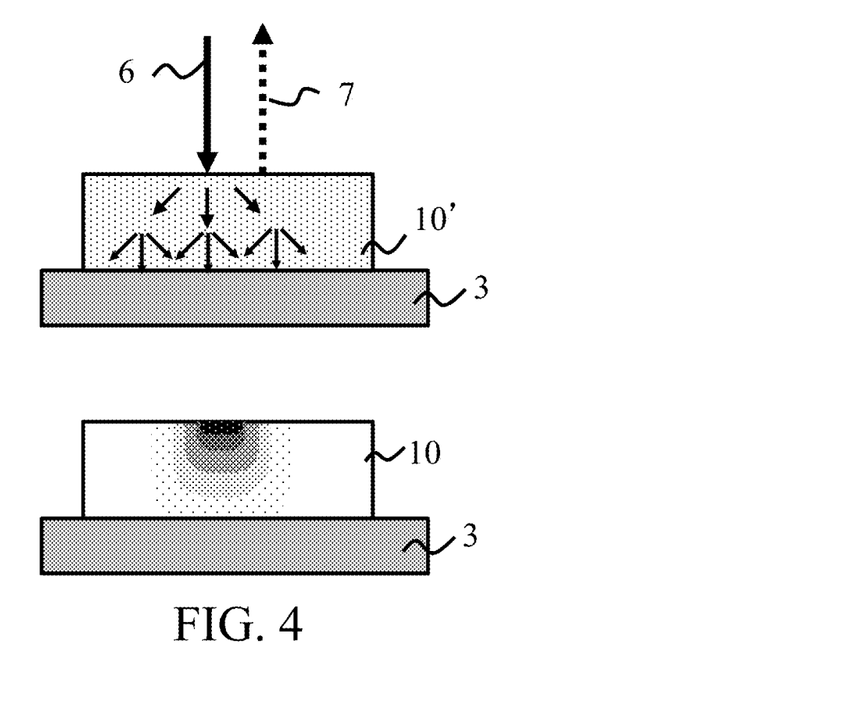
FIG. 4 illustrates excitation light traveling in a fluorescent layer and a temperature distribution in the fluorescent layer in the comparative example.

FIG. 2 illustrates the wavelength conversion element 20' according to a comparative example in which the fluorescent volume density in the fluorescent layer 10' is uniform in the layer thickness direction. FIGS. 3 and 4 schematically illustrates, on their lower sides, heat distributions generated in the respective fluorescent layers 10 and 10' in FIGS. 1 and 2. In these figures, a thick part means a large heat value (or high temperature), and a thin part means a small heat value (or low temperature). Most of the heat in the fluorescent layer is generated when the fluorescent particles absorb the excitation light and release part of it as heat rather than fluorescence. Hence, the heat value per unit volume depends on the intensity of the incident excitation light and the fluorescent volume density. The intensity distribution of the excitation light in the layer thickness direction (or a depth direction from the incident surface) also depends on the fluorescent volume density.

FIGS. 3 and 4 illustrate, on their upper sides, the excitation light 6 that has entered and traveled through the fluorescent layers 10 and 10'. An illustrated arrow indicates the traveling excitation light and the arrow thickness indicates its intensity. As the excitation light travels in each fluorescent layer, the excitation light while being diffused by a diffusion factor, such as fluorescent particles and pores inside the fluorescent layer, a part of which is absorbed by the fluorescent particles and converted into the fluorescent light. In other words, the excitation light receives two influences, such as the internal diffusion and absorptions by the fluorescent particles, and its intensity attenuates in the depth direction when the excitation light travels.

Figure 5:
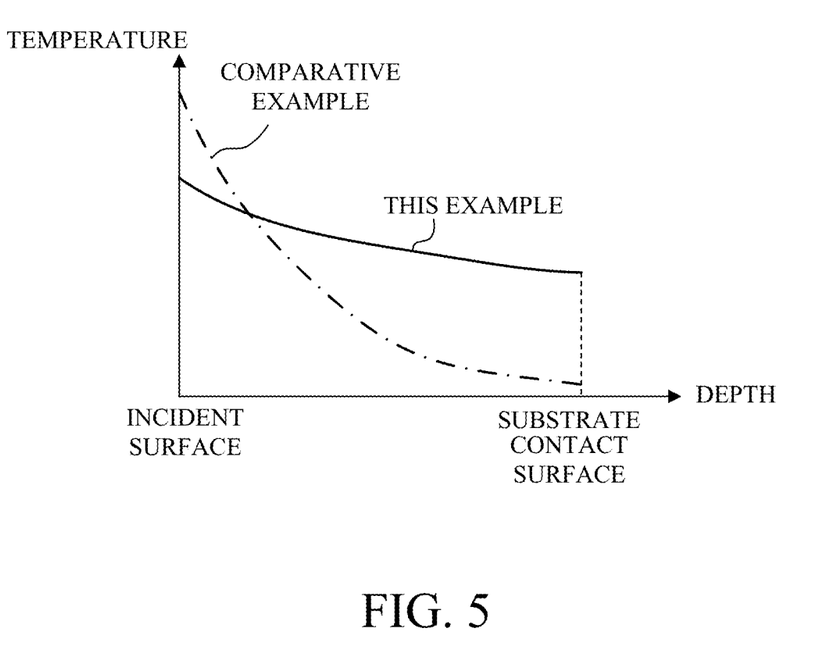
FIG. 5 compares the temperature distributions in the fluorescent layers according to the example 1 and the comparative example with each other.

The fluorescent layer 10' according to the comparative example illustrated in FIG. 2 in which the fluorescent volume density is uniform in the depth direction generates the intense heat first near the incident surface according to the high intensity of the excitation light. As the excitation light travels in the depth direction, its intensity attenuates. Therefore, as illustrated in FIG. 4, the thermal distribution occurs with a very high heat value on the incident surface side in the fluorescent layer 10' as compared with the substrate 3 side. As a result, the temperature gradient in the depth direction in the fluorescent layer 10' becomes steep as illustrated in FIG. 5 that illustrates a relationship between the depth and the temperature in the fluorescent layer 10'.

On the other hand, the intensity of the incident excitation light 6 in the fluorescent layer 10 according to this embodiment is the same as that of the fluorescent layer 10' according to the comparative example as illustrated in FIG. 3, but the fluorescent volume density of the incident surface side portion 10a is lower than that of the substrate side portion 10b and therefore the heat value of the incident surface side portion 10a is suppressed. Moreover, the intensity of the excitation light in the fluorescent layer 10 gently decreases as compared with that in FIG. 4 when the excitation light reaches the substrate side where the fluorescent volume density is high and the excitation light is absorbed by many fluorescent particles. As a result, as illustrated in FIG. 5, a temperature difference (temperature gradient in the depth direction) between the incident surface side portion and the substrate side portion of the fluorescent layer 10 is lower than that of the fluorescent layer 10' according to the comparative example and the temperature distribution in the fluorescent layer 10 becomes more uniform than that of the fluorescent layer 10' according to the comparative example.

Moreover, when the substrate 3 as a metal substrate is cooled on its backside, the cooling effect of the fluorescent layer 10 can be further enhanced. Then, since a higher cooling effect can be obtained in the fluorescent layer 10 on the side closer to the substrate 3, the fluorescent layer 10 according to this example in which the volume density of the fluorescent particles and the intensity of the excitation light are high is expected to have a higher heat radiation effect than that of the comparative example.

The thus configured wavelength conversion element 20 can moderate a temperature gradient in the fluorescent layer 10 and obtain a high heat radiation effect. In particular, when the density of the excitation light irradiated onto the fluorescent layer 10 is very high, it is effective to use the wavelength conversion element 20 according to this embodiment. More specifically, the maximum intensity of the excitation light on the incident surface of the fluorescent layer 10 of 10 W/mm$^2$ or higher improves the effect obtained by the wavelength conversion element 20 according to this embodiment. More preferably, the maximum intensity of the excitation light is 15 W/mm$^2$ or higher (more desirably 25 W/mm$^2$ or higher) for the improved effect.

The fluorescent volume density varies depending on a process, such as a coating process of the fluorescent layer 10 onto the substrate 3 and a sintering treatment, but is determined based on a weight ratio of the fluorescent particles and the binder to be used, a mixing ratio, and the like. Another practical evaluation method acquires a surface SEM in a plane parallel to the incident plane or a section SEM in the depth direction and roughly estimates based on an area ratio between a region of the fluorescent particles and a region of the binder or another region. An evaluation region in using this evaluation method may be sufficiently wider than the average particle diameter σ of the fluorescent particles. A "particle diameter" is a diameter when converted into a sphere having the same volume. An "average particle size" is an average value of particle diameters of all particles, but an average value of particle diameters of all the particles may be statistically calculated from the particle diameter of part of the particles. The evaluation region sufficiently wider than the average particle diameter σ of the fluorescent particles is, for example, a region with each side of about 2 to 100 times as long as σ or an area of 50σ$^2$ or wider. Furthermore, an evaluation preferably uses the average value in a plurality of evaluation areas.

For simplicity purposes, FIG. 1 describes the fluorescent layer 10 that is equally divided into two of the incident surface side portion 10a and the substrate side portion 10b, but the fluorescent material layer 10 is preferably formed such that the fluorescent volume density gradually changes in the depth direction. For example, in the example shown in FIG. 6(a), the fluorescent volume density gradually changes (increases) in the depth direction by 35%, 45%, and 65% in the incident surface side portion 10a, the middle portion 10c, and the substrate side portion 10b. However, strictly speaking, the density distribution of the fluorescent particles 5 fluctuates depending on the particle size and the particle size distribution of the fluorescent particles, and thus the density dispersion in the range of about the average particle size σ of the fluorescent particles is ignorable. In other words, when the fluorescent layer 10 is equally divided into two in the depth direction as illustrated in FIG. 1, the fluorescent volume density of the substrate side portion 10b may be higher than that of the incident surface side portion 10a.

More specifically, the fluorescent volume density of the substrate side portion 10b is preferably higher than that of the incident surface side portion 10a by 10% or higher, more preferably 15% or more. When the fluorescent volume density of the substrate side portion 10b exceeds a value that is twice as high as the fluorescent volume density of the incident surface side portion 10a, this density difference lowers the stability as the fluorescent layer and undesirably causes cracks and peels.

When the fluorescent volume density is less than 15%, it is necessary for the fluorescent layer to increase the thickness of the entire fluorescent layer so as to obtain a sufficient luminance. As the thickness increases, the light source image formed by the light from the fluorescent layer 10 becomes larger (relative to an optical system in a projector, which will be described later) and undesirably lowers the light collecting efficiency of the optical system. On the other hand, when the fluorescent volume density exceeds 70%, the ratio of the fluorescent particles to the binder becomes excessively high and lowers the stability as the fluorescent layer (film), causing cracks and peels.

From the above, the following condition is preferably satisfied where ρ0 is a fluorescent volume density (second volume density) of the incident surface side portion 10a and ρ1 is a fluorescent volume density (first volume density) of the substrate side portion 10b, $$1.1 \leq \rho1/\rho0 \leq 3.5.$$

In addition to or other than this condition, the following conditions are preferably satisfied:

$$25\% \leq \rho1 \leq 70\%$$

$$15\% \leq \Sigma 0 \leq 50\%.$$

The above conditional expressions may satisfy at least one of the following conditions.

$$1.3 \text{ (more preferably } 1.5) \leq \rho1/\rho0 \leq 3.0 \text{ (more preferably } 2.0)$$

$$45\% \leq \rho1 \leq 70\%$$

$$15\% \leq 0 \leq 40\%.$$

The fluorescent particles can use Ce-doped YAG (yttrium-aluminum-garnet)-based fluorescent body. Moreover, an inorganic and fluorescent material, such as a LuAG type or a sialon fluorescent body, which absorbs the ultraviolet wavelength to the blue wavelength and emits visible light from the green to red region can be selected and used properly.

Various methods can be used as a method for manufacturing the wavelength conversion element 20 (fluorescent layer 10) according to this embodiment. For example, one method disperses the fluorescent particles in an inorganic binder made of silica, alumina, titania-based sol-gel material, and applies and dries them. Another method disperses the fluorescent particles in glass or ceramics by mixing glass ceramics and fluorescent particles with each other and by sintering the mixture. Use of a high sintering temperature may deteriorate the characteristics of the fluorescent particles, so it is desirable to use a material, such as a low melting point glass etc. as the binder.

Figure 6A:
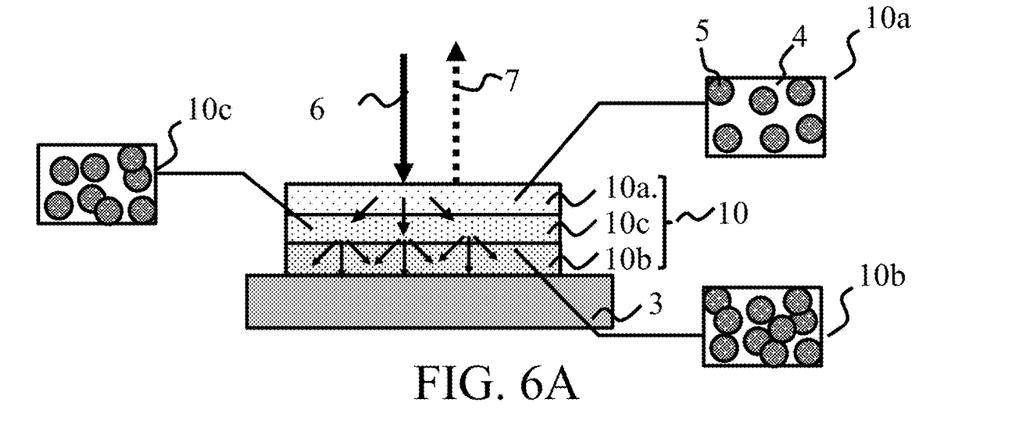
FIGS. 6A to 6C illustrate modifications of the example 1.

In order to obtain the fluorescent layer 10 having a different fluorescent volume density in the depth direction, for example, the following manufacturing method can be used. A first method previously prepares two or more materials in which fluorescent particles are dispersed in a pre-curing binder with different fluorescent material volume densities, applies these materials from the substrate 3 (or the unillustrated base surface) side in descending order of the fluorescent volume density, and laminates layers. In other words, this method prepares a first material in which fluorescent particles are dispersed at a first volume density in a binder and a second material in which fluorescent particles are dispersed in a binder at a second volume density higher than the first volume density. Then, the first material and the second material may be laminated so that the second material is located on the substrate side. As illustrated in FIG. 6(a), when there is an middle portion 10c having a third volume density between the first and second volume densities, a third material in which the fluorescent particles are dispersed in the binder with the third volume density is prepared and the first to third materials may be laminated.

Figure 6B:
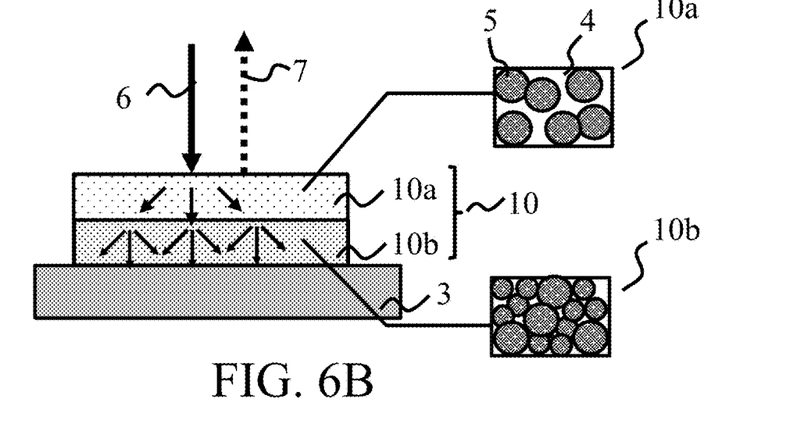
Figure 6C:
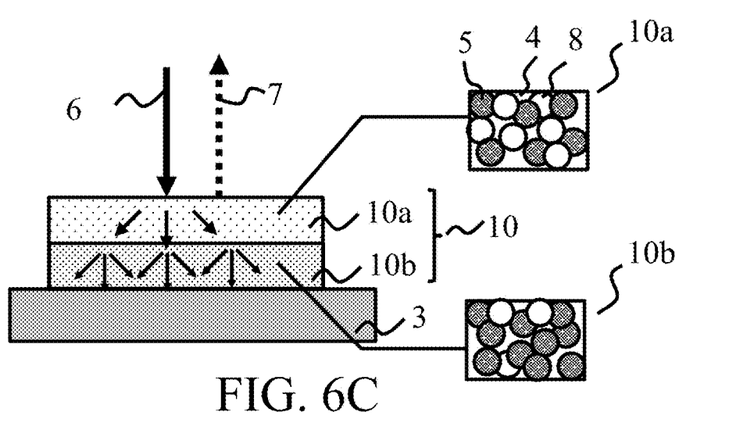

This configuration can facilitate a manufacture of the fluorescent layer 10 with a fluorescent volume density of the substrate side portion 10b higher than that of the incident surface side portion 10a. Then, as illustrated in FIG. 6(b), those having different particle sizes may be mixed with each other as the fluorescent particles 5 to be dispersed in a material in descending order of the fluorescent volume density. Further, as illustrated in FIG. 6(c), other particles 8 different from the fluorescent particles 5 may be mixed with each material, and the density ratio between the fluorescent particles 5 and the other particles 8 may be made different in these materials.

A second method is to manufacture the fluorescent layer 10 so as to provide a difference in the fluorescent volume density in the depth direction by precipitating fluorescent particles in a pre-curing binder or glass. In general, a mixture of materials having different specific gravities biases the density in the gravity direction. Hence, the fluorescent material layer 10 according to this embodiment can be manufactured by controlling the coating conditions and the sintering and cooling conditions so that the density of the fluorescent particles 5 is biased, and by disposing the high fluorescent volume density side on the substrate side. However, the extremely high density of the excitation light thermally deteriorates a binder made of an organic material, and lowers the stability and lifetime of the wavelength conversion element 20. It is therefore desirable that the fluorescent layer 10 is made only of an inorganic material. More specifically, the binder is preferably made of silica or a metal oxide or nitride or a mixture thereof.

An average particle size σ of the fluorescent particles 5 preferably falls in a range of about 1 to 10 μm. It is known that as a reduced average particle diameter σ of the fluorescent particles causes the luminous efficiency generally to be lower under the influence of the surface state of the fluorescent layer. In using the fluorescent particles having an average particle diameter σ of 1 μm or less, it is preferable to use it after an improvement treatment, such as a surface modification for preventing the efficiency from being degraded. The average particle diameter σ exceeding 10 μm is undesirable because the film thickness controllability and the in-plane density scattering in the micro region may be concerned.

The layer thickness of the fluorescent layer 10 preferably falls in a range of 0.02 mm or more and 0.5 mm or less. When the layer thickness is less than 0.02 mm, it is difficult to efficiently convert high-density excitation light into the fluorescent light. On the other hand, if the layer thickness exceeds 0.5 mm, the light collecting efficiency of the optical system in the projector will be lower and may cause cracks of the fluorescent layer 10. In order to provide a volume density gradient in the layer thickness direction (depth direction), the fluorescent layer 10 preferably has a layer thickness of at least 5 times as long as the average particle diameter σ.

As illustrated in FIG. 6(c), inorganic particles may be mixed as the other particles 8 different from the fluorescent particles 5 in the binder 4. Thereby, the fluorescent layers 10 having different fluorescent volume densities is expected to alleviate uneven stress caused by a difference in linear expansion between the fluorescent particles 5 and the binder 4 or glass, to improve the thermal conductivity, to control the diffusion intensity of the excitation light, or the like. The inorganic particles for this purpose preferably use a material with few absorptions in the wavelength of the excitation light and a refractive index at the wavelength of the excitation light different from that of the binder or glass material. If this refractive index difference is excessively small, the interface reflectance of the inorganic particles and the diffusion effect of excitation light decrease. More specifically, it is preferable to select inorganic particles having a refractive index difference of at least 0.05 (more preferably 0.10 or more) for the wavelength of excitation light or the fluorescence wavelength.

In using the inorganic particles so as to alleviate the linear expansion, the material of the inorganic particles, for example, preferably has a smaller coefficient of linear expansion than that of the material of the fluorescent particles or the binder. Using a material having a negative coefficient of linear expansion can further suppress the biased stress in the fluorescent layer. Thus, an appropriate material may be selected according to various purposes.

While the wavelength conversion element 20 according to this embodiment has been described, a wavelength conversion element having another configuration may be used. For example, FIG. 1 illustrates a reflection type wavelength conversion element 20 in which the fluorescent layer 10 is formed on the metal substrate 3, but the substrate 3 may have a light transmission property other than metal and in this case a transmission type wavelength conversion element may be used. For example, it may be a dielectric material (sapphire or spinel) having a high heat radiation property and a close linear expansion coefficient.

If the fluorescent layer 10 is self-supportable, the substrate 3 may be omitted. Even this configuration can provide an effect of moderating the temperature gradient by making different the fluorescent volume densities in the fluorescent layer 10 similarly to this embodiment.

The incident surface and the substrate contact surface of the fluorescent layer 10 may have a coating and an uneven structure. An reflection enhancing film, a dichroic mirror, and the like can be expected to improve the light utilization efficiency and the narrow band of the use wavelength. However, a fine uneven structure may change a shape (a period, a refractive index, and an occupation ratio) depending on a temperature change (or a linear expansion change) of the surface of the fluorescent layer, and affect the effect of the uneven structure. The configuration described in this embodiment can alleviate the stress of the fluorescent layer, suppress the crack and the like and the changes of the uneven structure on the surface, and make more stable the light emission characteristic of the fluorescent layer.

As the cooling means for the substrate 3, the wavelength conversion element 20 may be configured as a general rotating wheel body, or micro driving with a piezoelectric element and a local cooling mechanism by a Peltier element may be used.

This embodiment controls the density of the fluorescent particles in the fluorescent layer 10, moderates a temperature gradient caused by the irradiation of the excitation light, and prevents the stress caused by the temperature gradient.

Assume that the fluorescent layer 10 according to this embodiment has a thickness Th (mm), and this annular fluorescent layer has a width Wd (mm) in a radial direction, an inner diameter (radius) Ri (mm) of the annular shape, and an outer diameter (radius) Ro (mm) of the annular shape. In addition, assume that Aph (mm²) is an area of the fluorescent layer (the area of the annular surface or the area viewed from the light incident side) and Asu (mm²) is a thickness of the substrate 3 on which the fluorescent layer is formed (area viewed from the light incident side). Further assume that Li (watts) is the light energy entering the fluorescent layer 10.

Then, the thickness Th (mm) of the fluorescent layer is preferably 30 μm or more and 200 μm or less (more preferably 35 μm or more and 120 μm or less, and most preferably 50 μm or more and 100 μm or less). In addition, the fluorescent layer has an annular shape, and the width Wd of the annular shape and the thickness Th of the fluorescent layer preferably satisfy the following condition.

$$20 < Wd/Th < 1000$$

(more preferably $50 < Wd/Th < 300$, most preferably 120 or more)

This configuration can efficiently radiate the heat from the fluorescent layer to the substrate.

Herein, the width Wd of the annular shape of the fluorescent layer is preferably 5 mm or more and 20 mm or less (more preferably 5 mm or more and 12 mm or less, and most preferably 8 mm or less).

Furthermore, the following condition may be satisfied where the annular shape of the fluorescent layer has the outer diameter Ro and the inner diameter Ri:

$$1.05 < Ro/Ri < 2.00$$

(more preferably $1.10 < Ro/Ri < 1.70$, most preferably less than 1.40)

Satisfying the upper limit value can secure a predetermined area or wider for the substrate in a region inside the inner diameter and enable the heat to radiate to the inside and to the outside of the substrate, and this configuration is advantageous to the heat dissipation. Satisfying the lower limit value can prevent the fluorescent layer from increasing in size in the radial direction for the heat radiation. The inner diameter of the fluorescent layer is preferably 40 mm or more and 100 mm or less (more preferably 40 mm or more and 80 mm or less, most preferably 70 mm or less). The outer diameter of the fluorescent layer is preferably 50 mm or more and 130 mm or less (more preferably 50 mm or more and 105 mm or less, and most preferably 85 mm or less).

Next, the following condition may be satisfied where Li (watts) is the intensity of light incident on the fluorescent layer and Aph (mm²) is an area of the fluorescent layer:

$$5 < Aph/Li < 120 \ (mm^2/W)$$

(more preferably $5 < A/Li < 60$, most preferably $6 < A/Li < 40$).

Herein, the light intensity Li incident on the fluorescent layer is preferably 50 W or more and 500 W or less, more preferably 100 W or more and 500 W or less, and most preferably 250 W or more). The area Aph (mm²) of the fluorescent layer is preferably 1000 or more and 10000 or less (more preferably 1500 or more and 6500 or less, most preferably 3700 or less).

The light intensity Li (watt) incident on the fluorescent layer and the area Asu (mm²) of the substrate on which the fluorescent layer is formed may satisfy the following condition:

$$10 < Asu/Li < 500 \ (mm^2/W)$$

(more preferably $20 < A/Li < 260$, most preferably $30 < A/Li < 100$).

It is preferable that the area Asu (mm²) of the substrate is 5000 or more and 100000 or less (more preferably 6000 or more and 41000 or less, more preferably 10000 or less).

The area Aph of the fluorescent layer, the thickness Th of the fluorescent layer, and the area Asus of the substrate preferably satisfy the following condition:

$$3000 \ (mm) < Aph/Th < 1000000 \ (mm)$$

(more preferably $8000 < Aph/Th < 200000$, most preferably $10000 < Aph/Th < 58000$)

$$1.50 < Asus/Aph < 8.00$$

(more preferably $1.80 < Asus/Aph < 7.00$, most preferably $2.00 < Asus/Aph < 4.00$).

Table 1 shows the values of the above parameters in detail.

TABLE 1

| Parameter | Unit | Example 1 | Example 1A | Example 1B | Example 1C |
|---|---|---|---|---|---|
| Th | (mm) | 0.100 | 0.110 | 0.120 | 0.150 |
| Wd | (mm) | 10.0 | 10.0 | 12.5 | 13.0 |
| Ri | (mm) | 75.0 | 78.0 | 84.0 | 95.0 |
| Ro | (mm) | 88.0 | 88.0 | 96.0 | 110.0 |
| Aph | (mm²) | 6653.7 | 5212.4 | 6782.4 | 9655.5 |
| Asu | (mm²) | 25434.0 | 25434.0 | 30156.6 | 40094.7 |
| Li | (W) | 110 | 120 | 140 | 200 |
| Wd/Th | N/A | 100.0 | 90.9 | 104.2 | 86.7 |
| Ro/Ri | N/A | 1.2 | 1.1 | 1.1 | 1.2 |
| Aph/Li | mm²/W | 60.5 | 43.4 | 48.4 | 48.3 |
| Asu/Li | mm²/W | 231.2 | 212.0 | 215.4 | 200.5 |
| Aph/Th | (mm) | 66536.6 | 47385.5 | 56520.0 | 64370.0 |
| Asus/Aph | N/A | 3.823 | 4.880 | 4.446 | 4.153 |

| Parameter | Unit | Example 1D | Example 1E | Example 1F |
|---|---|---|---|---|
| Th | (mm) | 0.060 | 0.080 | 0.050 |
| Wd | (mm) | 8.0 | 8.5 | 5.0 |
| Ri | (mm) | 50.0 | 60.0 | 40.0 |
| Ro | (mm) | 60.0 | 70.0 | 50.0 |
| Aph | (mm²) | 3454.0 | 4082.0 | 2826.0 |
| Asu | (mm²) | 12462.7 | 16277.8 | 8490.6 |
| Li | (W) | 150 | 360 | 480 |
| Wd/Th | N/A | 133.3 | 106.3 | 100.0 |
| Ro/Ri | N/A | 1.2 | 1.2 | 1.3 |
| Aph/Li | mm²/W | 23.0 | 11.3 | 5.9 |
| Asu/Li | mm²/W | 83.1 | 45.2 | 17.7 |
| Aph/Th | (mm) | 57566.7 | 51025.0 | 56520.0 |
| Asus/Aph | N/A | 3.608 | 3.988 | 3.004 |

Example 2

Figure 7:
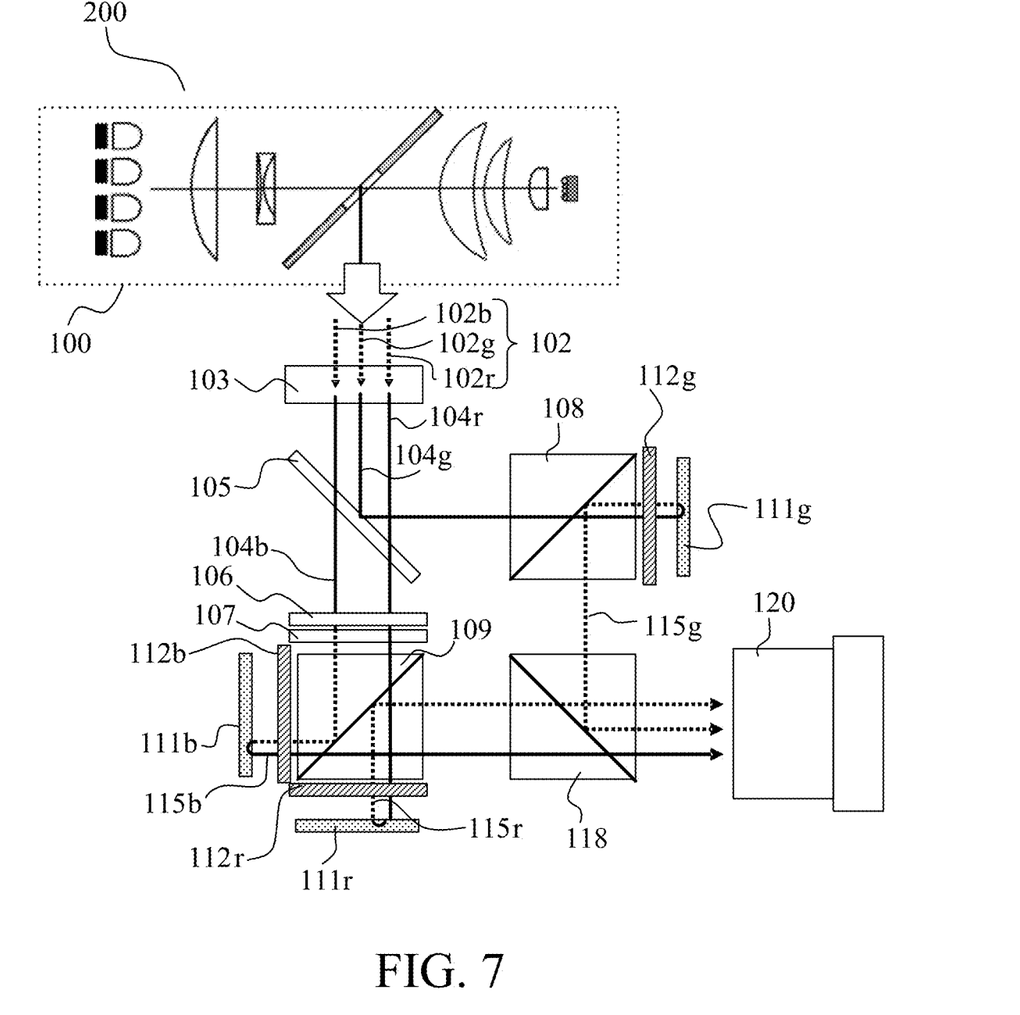
FIG. 7 illustrates a configuration of an image projection apparatus according to example 2 of the present invention.

Referring now to FIG. 7, a description will be given of a projector (image projection apparatus) 200 according to example 2 of the present invention. The projector 200 includes the light source apparatus 100 described in the example 1. White light 102 (red light 102r, green light 102g, and blue light 102b illustrated by dotted lines) emitted from the light source apparatus 100 enters the projector optical system described below. First, the red light 102r, the green light 102g, and the blue light 102b enter a polarization conversion element 103, and are converted into red illumination light 104r, green illumination light 104g, and blue illumination light 104b (illustrated by dotted lines) as linearly polarized light having a uniform polarization direction, respectively.

These illumination light beams 104r, 104g, and 104b are separated into red illumination light 104r, blue illumination light 104b, and green illumination light 104g by the dichroic mirror 105. The green illumination light 104g passes through the polarization beam splitter (referred to as PBS hereinafter) 108 and a phase compensation plate 112, and reaches a light modulation element 111g. The red and blue illumination light beams 104r and 104b pass through the polarizing plate 106 and enter the color selective phase plate 107. The color selective phase plate 107 rotates the polarization direction of the blue illumination light 104b by 90° while maintaining the polarization direction of the red illumination light 104r. The red illumination light 104r emitted from the color selective phase plate 107 passes through the PBS 109 and the phase compensation plate 112r and reaches the light modulation element 111r. The blue illumination light 104b emitted from the color selective phase plate 107 is reflected by the PBS 109, passes through the phase compensation plate 112b, and reaches the light modulation element 111b. Each light modulation element is configured by a reflection type liquid crystal panel or a digital micromirror device. A transmission type liquid crystal panel can also be used for the light modulation element.

The light modulation elements 111g, 111r, and 111b modulate the incident green, red, and blue illumination light beams 104g, 104r, and 104b to convert them into green, red, and blue image light beams 115g, 115b, and 115r. These image light beams 115g, 115b, and 115r are combined via the PBSs 108 and 109 and a combining prism 118, and are projected onto a projected surface such as a screen by the projection lens 120. Thereby, a color image as a projection image is displayed.

As described above, using the light source apparatus 100 described in the example 1 can realize the projector 200 capable of stably displaying a bright projection image.

Each of the above embodiments is merely a representative example, and various changes and modifications can be made to the respective embodiments in the implementation of the present invention.

The present invention can provide a wavelength conversion element that controls the density of the fluorescent particles in the fluorescent portion, suppresses a temperature gradient caused by the irradiation of the excitation light, and prevents the stress caused by the temperature gradient. The present invention can provide a light source apparatus capable of stably generating the fluorescent light and an image projection apparatus capable of stably displaying an excellent projected image.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A wavelength conversion element comprising a fluorescent portion in which fluorescent particles are dispersed in a binder,
    wherein the fluorescent portion has a first surface and a second surface which are opposite to each other in a thickness direction and excitation light is irradiated from a second surface side,
    wherein a volume density of the fluorescent particles in a first portion is higher than that in a second portion where the fluorescent portion is divided in the thickness direction into two of the first portion on a first surface side and the second portion on the second surface side, and
    wherein a thickness of the fluorescent portion is at least 5 times as long as an average particle size of the fluorescent particles.

2. The wavelength conversion element according to claim 1, further comprising a substrate configured to support the fluorescent portion, wherein the first surface contacts the substrate.

3. The wavelength conversion element according to claim 2, wherein the substrate is made of metal.

4. The wavelength conversion element according to claim 1, wherein the following condition is satisfied:

$$1.1 \leq \rho_1/\rho_0 \leq 2.0$$

where $\rho_1$ is the volume density of the first portion and $\rho_0$ is the volume density of the second portion.

5. The wavelength conversion element according to claim 1, wherein the following condition is satisfied:

$$25\% \leq \rho_1 \leq 70\%$$

$$15\% \leq \rho_0 \leq 50\%.$$

where $\rho_1$ is the volume density of the first portion and $\rho_0$ is the volume density of the second portion.

6. The wavelength conversion element according to claim 1, wherein inorganic particles different from the fluorescent particles are dispersed in the binder, and a refractive index difference between the inorganic particles and the binder is 0.05 or more.

7. A light source apparatus comprising:
    a light source configured to emit excitation light, and
    a wavelength conversion element according to claim 1.

8. The light source apparatus according to claim 7, wherein the intensity of the excitation light on the second surface of the fluorescent portion is 10 W/mm$^2$ or higher.

9. An image projection apparatus comprising:
    a light source apparatus according to claim 7; and
    an optical system configured to project an image by modulating light from the light source apparatus with a light modulation element.

10. The wavelength conversion element according to claim 7, wherein a light intensity Li incident on the fluorescent portion is 50 W or more and 500 W or less.

11. The wavelength conversion element according to claim 1, wherein a thickness Th of a fluorescent portion is 30 μm or more and 200 μm or less.

12. The wavelength conversion element according to claim 1, wherein the following condition is satisfied:

$$20 < Wd/Th < 1000$$

where Th is a thickness of the fluorescent portion, and Wb is a width of the fluorescent portion formed to have an annular shape.

13. The wavelength conversion element according to claim 1, wherein a width Wd of the fluorescent portion formed to have an annular shape is 5 mm or more and 20 mm or less.

14. The wavelength conversion element according to claim 1, wherein the following condition is satisfied:

$$1.05 < Ro/Ri < 2.00$$

where Ro is an outer diameter of the fluorescent portion formed to have an annular shape and Ri is an inner diameter of the fluorescent portion.

15. The wavelength conversion element according to claim 1, wherein an outer diameter Ro of the fluorescent portion formed to have an annular shape is 50 mm or more and 130 mm or less.

16. The wavelength conversion element according to claim 1, wherein an inner diameter Ri of the fluorescent portion formed to have an annular shape is 40 mm or more and 100 mm or less.

17. The wavelength conversion element according to claim 1, wherein an area Aph of the fluorescent portion is 1000 mm$^2$ or more and 10000 mm$^2$ or less.

18. The wavelength conversion element according to claim 1, wherein the following condition is satisfied:

$$3000\ (\text{mm}) < Aph/Th < 1000000\ (\text{mm})$$

where Aph is an area of the fluorescent portion and Th is a thickness of the fluorescent portion.

19. The wavelength conversion element according to claim 1, wherein the following condition is satisfied:

$$1.50 < Asus/Aph < 8.00$$

where Aph is an area of the fluorescent portion and Asus is an area of the substrate.

20. The wavelength conversion element according to claim 1, wherein the following condition is satisfied:

$$5 < Aph/Li < 120\ (\text{mm}^2/\text{W})$$

where Li is an intensity of light incident on the fluorescent portion, and Aph is an area of the fluorescent portion.

21. A manufacturing method of a wavelength conversion element that includes a fluorescent portion in which fluorescent particles are dispersed in a binder, wherein the fluorescent portion has a first surface and a second surface which are opposite to each other in a thickness direction and excitation light is irradiated from a second surface side, the manufacturing method comprising the steps of:
- preparing a first material in which the fluorescent particles are dispersed with a first volume density in the binder and a second material in which the fluorescent particles are dispersed with a second volume density higher than the first volume density in the binder; and
- laminating the first material and the second material so that the second material is located on a first surface side and a thickness of the fluorescent portion is at least 5 times as long as an average particle size of the fluorescent particles.

\* \* \* \* \*